US009515580B2

(12) United States Patent
Pinkerton et al.

(10) Patent No.: US 9,515,580 B2
(45) Date of Patent: *Dec. 6, 2016

(54) MEMBRANE-BASED NANO-ELECTROMECHANICAL SYSTEMS DEVICE AND METHODS TO MAKE AND USE SAME

(71) Applicant: Clean Energy Labs, LLC, Austin, TX (US)

(72) Inventors: Joseph F Pinkerton, Austin, TX (US); David A Badger, Austin, TX (US); William Neil Everett, Cedar Park, TX (US); William Martin Lackowski, Austin, TX (US)

(73) Assignee: Clean Energy Labs, LLC, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/409,731

(22) PCT Filed: Jun. 19, 2013

(86) PCT No.: PCT/US2013/046628
§ 371 (c)(1),
(2) Date: Dec. 19, 2014

(87) PCT Pub. No.: WO2013/192335
PCT Pub. Date: Dec. 27, 2013

(65) Prior Publication Data
US 2015/0180372 A1 Jun. 25, 2015

Related U.S. Application Data

(60) Provisional application No. 61/661,654, filed on Jun. 19, 2012.

(51) Int. Cl.
H02N 1/08 (2006.01)
B81B 3/00 (2006.01)
(Continued)

(52) U.S. Cl.
CPC .......... H02N 1/08 (2013.01); B81B 3/00 (2013.01); G02B 7/1821 (2013.01); H01G 5/16 (2013.01);
(Continued)

(58) Field of Classification Search
CPC ........ H03H 9/00; H03H 3/007; H03H 9/0538; H03H 11/1208; H04R 7/00
(Continued)

(56) References Cited

U.S. PATENT DOCUMENTS 8,735,947 B1* 5/2014 Guo et al. ............... 257/238
8,852,985 B2* 10/2014 Cai et al. ................ 438/53
(Continued)

FOREIGN PATENT DOCUMENTS

WO 2011097390 A1 8/2011
WO 2012051053 A1 4/2012

Primary Examiner — Brook Kebede
(74) Attorney, Agent, or Firm — Dickinson Wright PLLC; Ross Spencer Garsson

(57) ABSTRACT

Nano-electromechanical systems (NEMS) devices that utilize thin electrically conductive membranes, which can be, for example, graphene membranes. The membrane-based NEMS devices can be used as sensors, electrical relays, adjustable angle mirror devices, variable impedance devices, and devices performing other functions.

19 Claims, 15 Drawing Sheets

(51) Int. Cl.
*G02B 7/182* (2006.01)
*H01G 5/16* (2006.01)
*H01H 59/00* (2006.01)
*B82Y 20/00* (2011.01)

(52) U.S. Cl.
CPC ....... *H01H 59/00* (2013.01); *B81B 2203/0127* (2013.01); *B82Y 20/00* (2013.01); *Y10S 977/774* (2013.01)

(58) Field of Classification Search
USPC .................................................. 257/415–417
See application file for complete search history.

(56) References Cited

U.S. PATENT DOCUMENTS

| 8,901,680 B2* | 12/2014 | Cai et al. ....................... 257/415 |
| 2010/0013574 A1 | 1/2010 | Huang |
| 2010/0214034 A1* | 8/2010 | Peng et al. .................... 331/154 |

* cited by examiner

MEMBRANE-BASED NANO-ELECTROMECHANICAL SYSTEMS DEVICE AND METHODS TO MAKE AND USE SAME

CROSS-REFERENCE TO RELATED PATENT APPLICATIONS

This application is the §371 national phase application and claims priority and benefit to PCT/US13/46628, filed on Jun. 19, 2013; and claims priority benefits to U.S. Provisional Application Ser. No. 61/661,654, filed on Jun. 19, 2012. All of these patent applications are entitled "Membrane Based Nano-Electromechanical Systems Device And Methods To Make And Use Same," and are commonly assigned to the Assignee of the present invention and is hereby incorporated herein by reference in its entirety for all purposes.

TECHNICAL FIELD

The present invention relates to membrane-based nano-electromechanical systems (NEMS) devices and methods to make and use such devices. The membrane-based NEMS devices utilize thin, electrically conductive membranes, which can be, for example, graphene membranes. The membrane-based NEMS devices can be used as sensors, electrical relays, adjustable-angle mirror devices, variable impedance devices, and devices performing other functions.

BACKGROUND

A class of small devices exists that are referred to as micro-electromechanical systems (MEMS). Each major dimension of a MEMS device is generally on the order of 1-100 microns (thus "micro"). MEMS devices typically range in size from 20 μm to 1 mm. The devices often include a central unit that processes data and several components that interact with the outside environment, such as sensors. The usage of MEMS devices has dramatically increased over the past several years as companies have integrated MEMS chips into consumer products, such as cell phones and computers.

Such uses include: as sensors, electrical relays, adjustable-angle mirror devices, variable impedance devices, and devices that perform other functions (such as transducers and actuators).

The types of commercial applications include:

Gyroscopes and accelerometers, such as the gyroscope/accelerometer chips used in cell phones to re-orient the screen when turned 90 degrees and allow users to interact with cell phones in more complex ways. MEMS devices are used as gyroscopes in automobiles and other devices to detect yaw, pitch, and roll. This can be used to deploy a roll over bar or to trigger dynamic stability control. MEMS devices are also used as accelerometers in game controllers, personal media players, and digital cameras. They are also used in personal computers to park the hard disc head, when free-fall is detected, to prevent damage and data loss. MEMS devices have also been used in accelerometers in cars, such as to deploy airbags during a collision.

Microphones, such as microphones in cell phones, head sets, and lap top computers.

Magnetometers, such as magnetometers to perform the compass function in cell phones.

Sensors, such as pressure sensors in car tire pressure sensors or blood pressure sensors. Further, for example, biosensors and chemosensors used in medical- and health-related technologies.

Inkjet printers, such as inkjet printers that use piezoelectrics or thermal bubble ejection to deposit ink on paper.

Displays, such as used in digital micro-mirror devices in projectors or such as for interferometric modulator displays.

Optical switching, such as used for switching technology and alignment for data communication.

Fluid flow, such as for micro-cooling systems.

Although MEMS devices are relatively small, MEMS devices are technologically complex structures that cost more per unit wafer area than CMOS chips to fabricate.

Accordingly, there is a need for devices that are smaller (on the nanoscale rather than the microscale), lower cost, simpler in design, and allow for facile fabrication.

SUMMARY OF THE INVENTION

Applicants have discovered nano-electromechanical systems (NEMS) devices that utilize thin, electrically conductive membranes (referred to herein as "membrane-based NEMS devices"). The thin membrane is generally on the order of one nanometer. The thin membrane can be made of graphene; however, other electrically conductive membranes (such as reduced graphene oxide) or semiconductor-based membranes (such as molybdenum disulfide) can be used.

The membrane-based NEMS devices can be used as sensors ("membrane-based NEMS sensors"), electrical relays ("membrane-based NEMS relays"), adjustable-angle mirror devices ("membrane-based NEMS adjustable-angle mirrors"), variable impedance devices ("membrane-based NEMS variable impedance devices"), and devices performing other functions.

In general, in one aspect, the invention features a NEMS device that includes an electrically conductive membrane.

Implementations of the invention can include one or more of the following features:

The electrically conductive membrane can be a graphene membrane.

The NEMS device can be a membrane-based NEMS sensor.

The NEMS device can be a membrane-based NEMS relay.

The NEMS device can be a membrane-based NEMS adjustable-angle mirror.

The NEMS device can be a membrane-based NEMS variable impedance device.

A metallic object can be on one side of the electrically conductive membrane. The metallic object can be in the form of a cylinder. The metallic object can be in the form of a disc.

The NEMS device can further include a first plurality of traces operable for moving the electrically conductive membrane. The first plurality of traces can be operable for moving the electrically conductive membrane from a first position to a second position. The NEMS device can further include a second plurality of traces operable for sensing a change in a characteristic based upon the movement of the electrically conductive membrane.

The NEMS device can further include a first plurality of traces operable for sensing a change in a characteristic based upon the movement of the electrically conductive membrane.

In general, in another aspect, the invention features a method of using the NEMS devices described above.

In general, in another aspect, the invention features a sensor that includes a substrate having a cavity, a thin electrically conductive membrane bounding at least part of the cavity, a first source trace electrically connected to the thin electrically conductive membrane, a first sensor trace operatively connected to the substrate, and a first gate trace operatively connected to the substrate.

Implementations of the invention can include one or more of the following features:

The thin electrically conductive membrane can cover the cavity.

The thin electrically conductive membrane can include one layer of graphene.

The thin electrically conductive membrane can include multiple layers of graphene.

The first gate trace can be located within the cavity.

The first sensor trace can be located between the first gate trace and the thin electrically conductive membrane.

The sensor can further include a second source trace electrically connected to the thin electrically conductive membrane.

The sensor can further include a second sensor trace located within the cavity.

The sensor can further include a second gate trace located within the cavity.

The sensor can further include a proof mass mechanically connected to the thin electrically conductive membrane.

The proof mass can include metal.

The proof mass can include copper.

The proof mass can be a mass made by the process wherein the proof mass was chemically etched from the same metallic foil used to grow the thin electrically conductive membrane.

The sensor can further include an array of particles mechanically connected to the thin electrically conductive membrane.

The particles can include quantum dots.

In general, in another aspect, the invention features a sensor that includes a substrate having a cavity, a thin electrically conductive membrane bounding at least part of the cavity, a first source trace electrically connected to the thin electrically conductive membrane, a first sensor trace located within the cavity, and a proof mass mechanically connected to the thin electrically conductive membrane.

Implementations of the invention can include one or more of the following features:

The sensor can further include a first gate trace located within the cavity.

The thin electrically conductive membrane can include one layer of graphene.

The thin electrically conductive membrane can include multiple layers of graphene.

The thin electrically conductive membrane can cover the cavity.

The proof mass can include metal.

The proof mass can include copper.

In general, in another aspect, the invention features a sensor that includes a substrate having a cavity, a thin electrically conductive membrane bounding at least part of the cavity, a first source trace electrically connected to the thin electrically conductive membrane, a second source trace electrically connected to the thin electrically conductive membrane, and a first sensor trace located within the cavity.

Implementations of the invention can include one or more of the following features:

The sensor can further include a first gate trace located within the cavity.

The sensor can further include a third source trace electrically connected to the thin electrically conductive membrane.

The sensor can further include a second sensor trace located within the cavity.

The thin electrically conductive membrane can include one layer of graphene.

The thin electrically conductive membrane can include multiple layers of graphene.

The thin electrically conductive membrane can cover the cavity.

In general, in another aspect, the invention features a variable angle mirror that includes a substrate having a cavity, a thin electrically conductive membrane bounding at least part of the cavity, a first source trace electrically connected to the thin electrically conductive membrane, an a first gate trace located within the cavity.

Implementations of the invention can include one or more of the following features:

The variable angle mirror can further include a reflective member mechanically connected to the thin electrically conductive membrane.

The thin electrically conductive membrane can include one layer of graphene.

The thin electrically conductive membrane can include multiple layers of graphene.

The thin electrically conductive membrane can cover the cavity.

In general, in another aspect, the invention features a variable impedance device that includes a substrate having a cavity, a thin electrically conductive membrane bounding at least part of the cavity, a first source trace electrically connected to the thin electrically conductive membrane, a first sensor trace located within the cavity, and a first gate trace operatively connected to the substrate.

Implementations of the invention can include one or more of the following features:

The thin electrically conductive membrane can include one layer of graphene.

The thin electrically conductive membrane can include multiple layers of graphene.

The thin electrically conductive membrane can cover the cavity.

The first gate trace can be located within the cavity.

The variable impedance device can further include a second source trace electrically connected to the thin electrically conductive membrane.

The variable impedance device can further include a second sensor trace located within the cavity.

The gate trace can be located within the cavity.

In general, in another aspect, the invention features an electrical relay that includes a substrate having a cavity, a thin electrically conductive membrane bounding at least part of the cavity, a first source trace electrically connected to the thin electrically conductive membrane, a first drain trace located within the cavity, a second drain trace located within the cavity, and a first gate trace operatively connected to the substrate.

Implementations of the invention can include one or more of the following features:

The e thin electrically conductive membrane can include of one layer of graphene.

The thin electrically conductive membrane can include multiple layers of graphene.

The thin electrically conductive membrane can cover the cavity.

The first gate trace can be located within the cavity.

The electrical relay can further include a second gate trace located within the cavity.

The electrical relay can further include a third drain trace located within the cavity.

The electrical relay can further include a metal disk mechanically connected to the thin electrically conductive membrane.

The metal disk can include gold.

In general, in another aspect, the invention features a method of operating a sensor. The method includes the step of applying a voltage between a source trace and a gate trace to decrease the distance between a thin electrically conductive membrane and a sensor trace. The method further includes the step of measuring a change in capacitance between the thin electrically conductive membrane and the sensor trace in response to a force.

Implementations of the invention can include one or more of the following features:

The force can be an inertial force.

The force can be a magnetic force.

The force can be due to an air pressure difference across the thin electrically conductive membrane.

The thin electrically conductive membrane can be electrically connected to the source trace.

The thin electrically conductive membrane can include one layer of graphene.

The thin electrically conductive membrane can include multiple layers of graphene.

In general, in another aspect, the invention features a method of harvesting energy. The method includes the step of applying a first time-varying voltage between a source trace and a gate trace to move a proof mass that is mechanically connected to a thin electrically conductive membrane. The method further includes the step of applying a second time-varying voltage between a first sensor trace and the source trace.

Implementations of the invention can include one or more of the following features:

The thin electrically conductive membrane can be electrically connected to the source trace.

The method can further include applying the second time-varying voltage between a second sensor trace and the source trace.

The method can further include applying the second time-varying voltage between a third sensor trace and the source trace.

The thin electrically conductive membrane can include one layer of graphene.

The thin electrically conductive membrane can include multiple layers of graphene.

The proof mass can include metal.

There has thus been outlined, rather broadly, the more important features of the invention in order that the detailed description thereof may be better understood, and in order that the present contribution to the art may be better appreciated. There are additional features of the invention that will be described hereinafter.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

DETAILED DESCRIPTION

The present invention is a nano-electromechanical systems (NEMS) device that utilizes thin, electrically conductive membranes. The thin membrane is generally on the order of one nanometer while the other two dimensions are microns in dimension.

The thin membrane can be made of graphene. Graphene membranes (also otherwise referred to as "graphene drums") have been manufactured for limited research purposes using process such as disclosed in Lee et al. Science, 2008, 321, 385-388. A graphene membrane is atomically thin. Graphene sheets—one-atom-thick two-dimensional layers of $sp^2$-bonded carbon—have a range of unique electrical, thermal and mechanical properties. Other atomically thin materials also exist that have their own unique electrical, thermal, and mechanical properties. Such atomically thin materials include graphene oxide and graphene/graphene oxide composites, such as described and discussed in commonly owned U.S. patent application Ser. No. 13/152,122 (Everett et al.) and Ser. No. 12/571,958 (Pinkerton), which are each incorporated herein in their entirety.

While embodiments of the present invention having graphene are discussed and described herein, the thin membranes utilized in the present invention are not limited to graphene. Rather, the thin membranes can be any thin material that is sufficiently mechanically robust (such as, for example, a thin membrane of graphene oxide or any combination of materials that form a sufficiently robust composite material, such as a thin membrane of graphene and graphene oxide) to span the lateral dimensions of the target substrate feature (such as micro or nano wells). Thus, the discussion of graphene is for exemplary purposes and is not intended to limit the scope of the present invention.

Furthermore, the thin membranes used in the present invention are generally a membrane that is atomically thin. For single-layer graphene membranes, the thickness is sub-nanometer; membranes containing multiple graphene layers, graphene/graphene oxide composites, etc. are typically on the order of about 1 to about 25 nanometers.

The membrane-based NEMS device of the present invention can perform the same functions as a MEMS device but are much smaller (generally around 100 times smaller), lower cost, and more facile to design and fabricate.

Such membrane-based NEMS devices can be used to function as accelerometers, magnetometers, gyroscopes, resonators/clocks, thermometers, barometers, variable capacitors, electrical relays, humidity sensors, light reflectors for digital light projectors and optical switching, microphones, pressure sensors (other than microphone) and variable inductors. Unlike many MEMS, the membrane-based NEMS devices of the present invention can perform more than one of these functionalities simultaneously. Furthermore, the membrane-based NEMS devices of the present invention can also store energy and perform energy harvesting.

Figure 1:
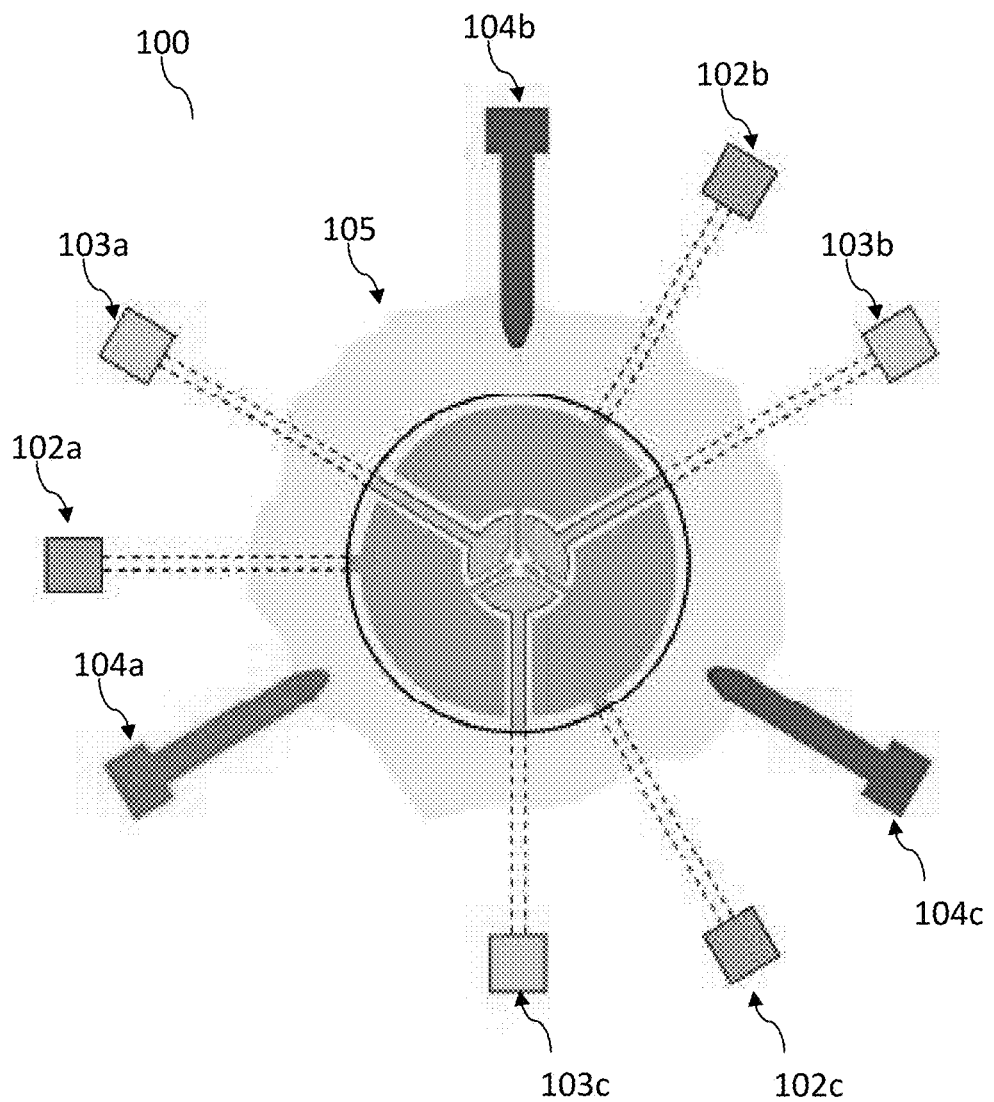
FIG. 1 depicts an overhead view of a membrane-based NEMS device that is an embodiment of the present invention.

Referring to the figures, FIG. 1 depicts shows a top view of a membrane-based NEMS device 100 that is an embodiment of the present invention. The membrane-based NEMS device includes lower traces 102a, 102b, and 102c, which can operate as gates/drivers, i.e. electrically conductive members that can be charged to a voltage relative to an electrically conductive membrane 101, resulting in motion of the electrically conductive membrane 105 relative to the device substrate. (Such lower traces can also be referred to as "gate traces" or "actuation traces"). The membrane-based NEMS device also has middle traces 103a, 103b, and 103c, which can operate as drains/sensors (also referred to as "sensor traces" or "drain traces") and upper traces 104a, 104b, and 104c, which can operate as sources (also referred to as "source traces" or "membrane traces"). The membrane-based NEMS device 100 includes the electrically conductive membrane 105 (graphene) that is shown as having an irregular edge. While these traces are referred to herein as upper, middle, and lower (relative to the plane of the electrically conductive membrane), this orientation is utilized for descriptive purposes only. Such orientation of the traces is not limiting and can be readily changed to other orientations within the scope of the present invention. The traces can be made of metals, such as those used in the semiconductors industry, such as Al, Ti, Ni, W, and combinations thereof. Other meals can alternatively or additionally be used, such as Au, Ag, Pt, and combinations thereof and combinations with one or more of Al, Ti, Ni, and W.

Figure 2A:
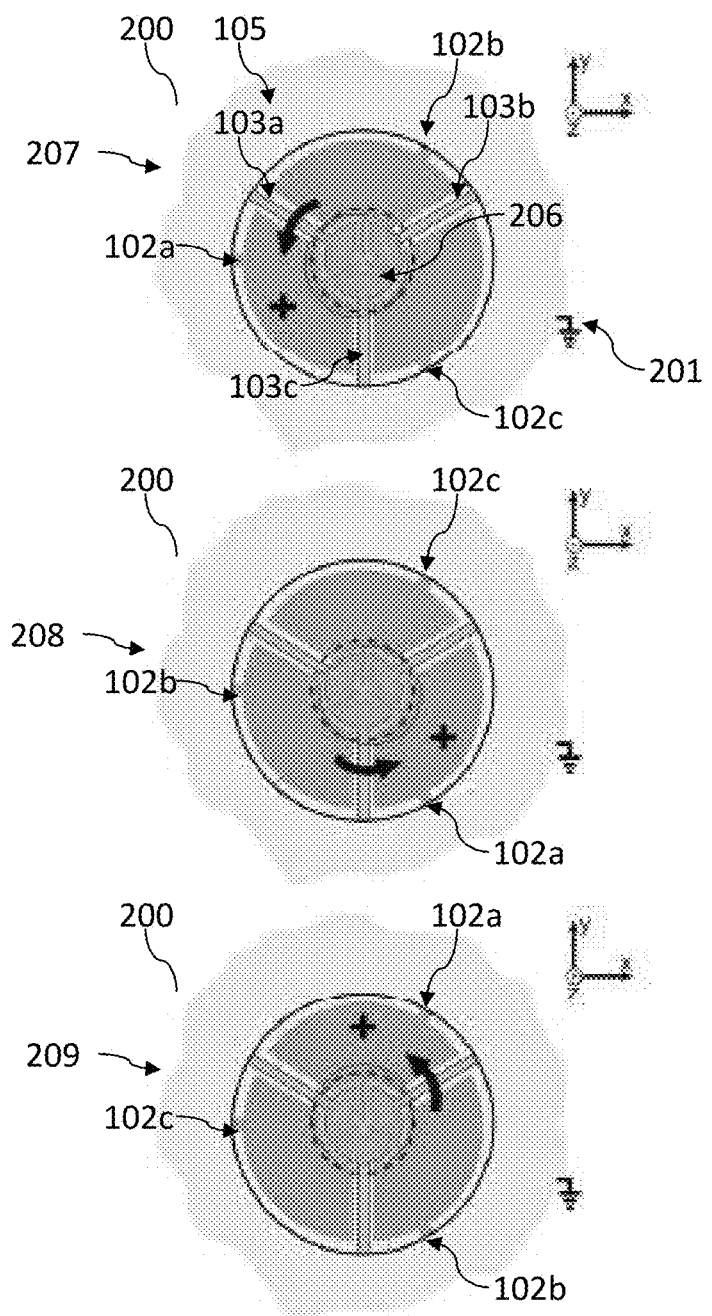
FIG. 2A depicts an overhead view of a membrane-based NEMS device of the present invention, which illustrates how electrically charged regions can be used to gyrate the center of mass of a metal cylinder mounted atop the electrically conductive membrane of the NEMS device.
Figure 6:
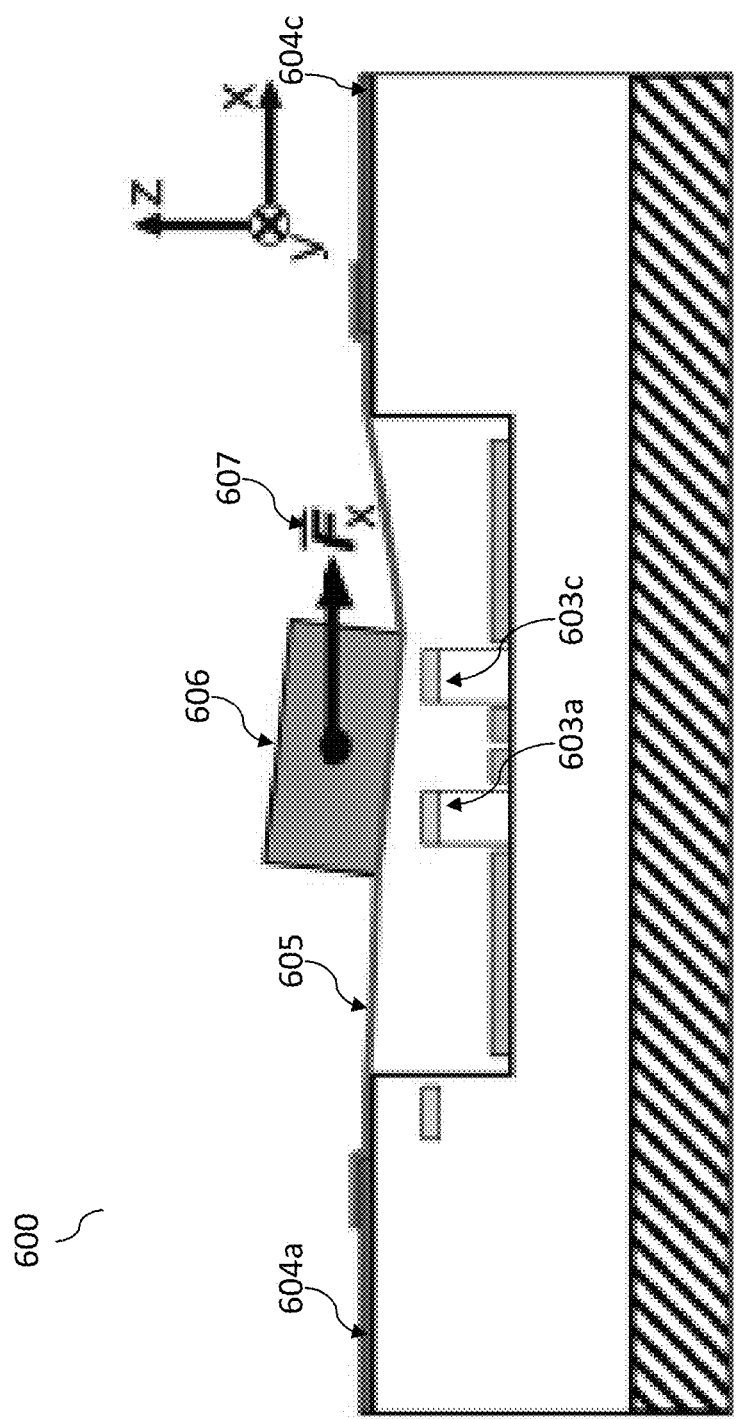
FIG. 6 depicts a side view of another membrane-based NEMS device that is an embodiment of the present invention used as an accelerometer.

FIG. 2A shows an overhead view of a membrane-based NEMS device 200 depicting how the lower traces (102a, 102b, and 102c of FIG. 1) can be used to gyrate the center of mass (CM) of a cylinder 206 (such as a metal cylinder) mounted on top of the electrically conductive membrane 105 (the cylinder 206 on the electrically conductive membrane 105 is shown with more detail in FIG. 6). As shown in FIG. 2A, the electrically conductive membrane 105 is electrically connected to ground 201.

As depicted in FIG. 2A, the gyration of the CM of the cylinder 206 is shown to occur in a counter-clockwise direction from position 207 to position 208 and to position 209. The cylinder 206 can be made of copper, nickel, or other metals. Such other metals include: aluminum, gold, platinum, etc. Alternatively, the cylinder 206 can be made of non-metal materials, such as silicon dioxide. For instance, there may be times where a lighter weight cylinder is needed so that a smaller response is received from the less massive cylinder. In such instance, a non-metallic material may be preferable. Likewise, there may be a time when the cylinder needs to be non-conductive or have a specific mechanical property (very-stiff, elastomeric, etc.) that would not be possible if a metal cylinder is utilized.

In some embodiments of the present invention, the cylinder 206 can be residual copper left over from the graphene-copper etching process as described in commonly owned PCT Patent Appl. No. PCT/US2011/066,497 (Everett, et al.), which is incorporated in its entirety herein. Alternatively, a metal (or other material) can be deposited upon the electrically conductive membrane (such as graphene) to create the cylinder 206 needed.

Moreover, the geometric shape of the material deposited on the electrically conductive membrane need not be cylindrical. Rather, shapes with different moments of inertia can be utilized, which can be selected based upon the use of the membrane-based NEMS device. Combinations of shapes can also be used. For example, a cylinder with one diameter can be connected to a disk (which is fixed to a graphene membrane) having a larger diameter.

Referring back to FIGS. 2A-2C, FIG. 2B depicts an oblique view of the membrane-based NEMS device 200 shown in FIG. 2A. FIG. 2C depicts the same side view of the membrane-based NEMS device 200 shown in FIG. 2B, with both the cylinder 206 and electrically conductive membrane 105 illustrated as being translucent so that middle traces 103a, 103b, and 103c and lower traces 102a, 102b, and 102c are more readily seen.

As the CM of the cylinder 206 moves (as shown in a counterclockwise direction), the middles traces (103a, 103b, and 103c) will sense a change in capacitance between a given middle trace (103a, 103b, and 103c) and upper trace (104a, 104b, and 104c of FIG. 1). If the membrane-based NEMS device 200 is undisturbed, these changes in capacitance will be balanced and cyclical. If the membrane-based NEMS device 200 is rotated about any axis (there are 3 rotational axes), the capacitance will become unbalanced and vary with time. These changes in capacitance can be converted into a rotation magnitude by electronic circuits connected to the NEMS traces. Thus, the membrane-based NEMS device 200 can function as a 3-axis gyroscope. (In this embodiment, the cylinder 206 is the "proof mass.")

If the driver sequence is altered such that the CM gyrates in the opposite direction from what is described above, the derived rotation values will be of opposite polarity when the membrane-based NEMS device 200 is rotated about an axis. However, capacitance changes caused by linear acceleration will be sensed with the same polarity as before. Therefore, in some embodiments, it may be useful and desirable to use two membrane-based NEMS devices, each having opposite gyration sequences so that rotational signals can be separated from linear acceleration signals. This can be accomplished by subtracting the output signals of one membrane-based NEMS device from the other, thus measuring them differentially so that the common mode effects due to linear acceleration are removed.

Forcing the CM to oscillate in one plane will also cause changes in the time-varying capacitance that can be interpreted by electronic circuits as a global rotation. In some embodiments, it may be useful and desirable to use two membrane-based NEMS devices to sense rotational motion in three axes; one with the CM gyrating and the other with the CM oscillating in one plane.

This membrane-based NEMS device 200 can store kinetic energy by gyration of the CM of the cylinder 206. If there is a power outage, the periodic changes in capacitance can be used to convert the kinetic energy of the moving mass into electrical energy to power the membrane-based NEMS sensor/device (and possibly small external devices, too).

If many membrane-based NEMS devices are used in parallel, a useful amount of energy can be extracted from external motions (such as somebody twisting their smart phone against the torque of an array of NEMS gyroscopes), thus, for example, the battery life of a phone may be extended (by such conversion of mechanical motion into electrical energy).

Figure 2B:
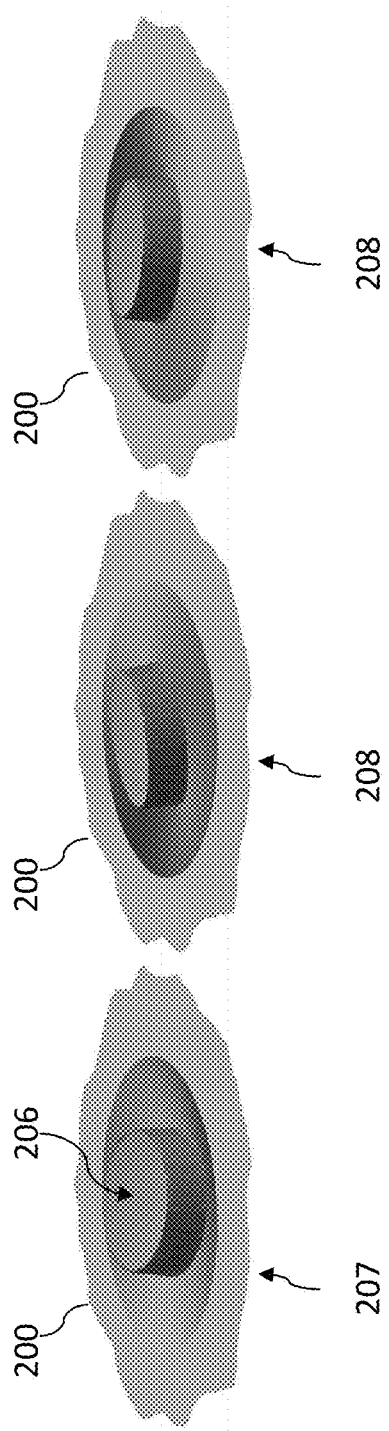
FIG. 2B depicts a side view of the membrane-based NEMS device shown in FIG. 2A having a metal cylinder on top of the electrically conductive membrane.
Figure 2C:
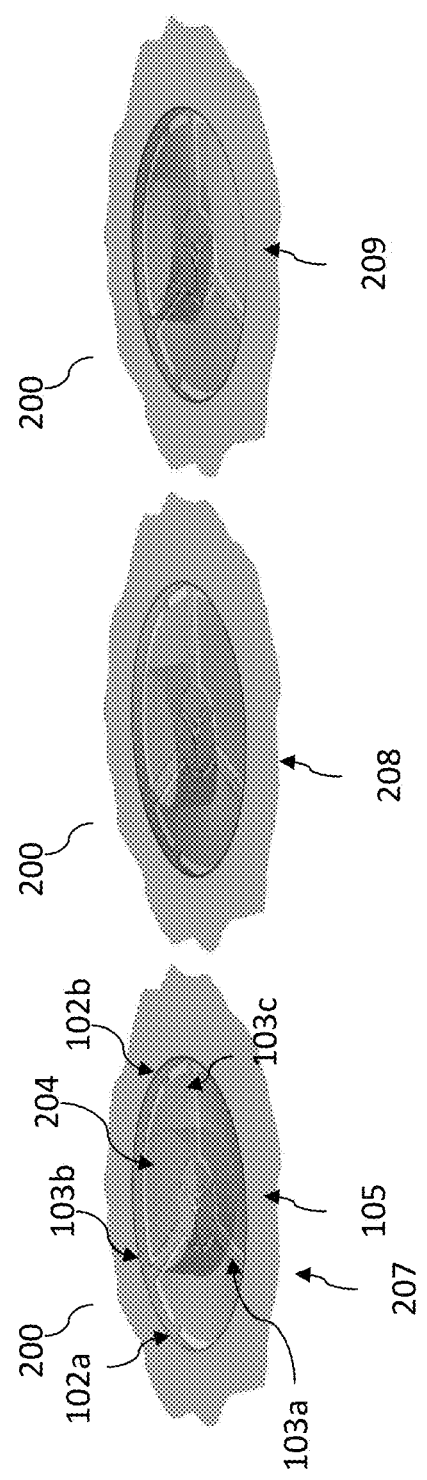
FIG. 2C depicts the same side view of the membrane-based NEMS device shown in FIG. 2B, with the metal cylinder and electrically conductive membrane illustrated as being translucent so that the underlying device structures can be seen.
Figure 3A:
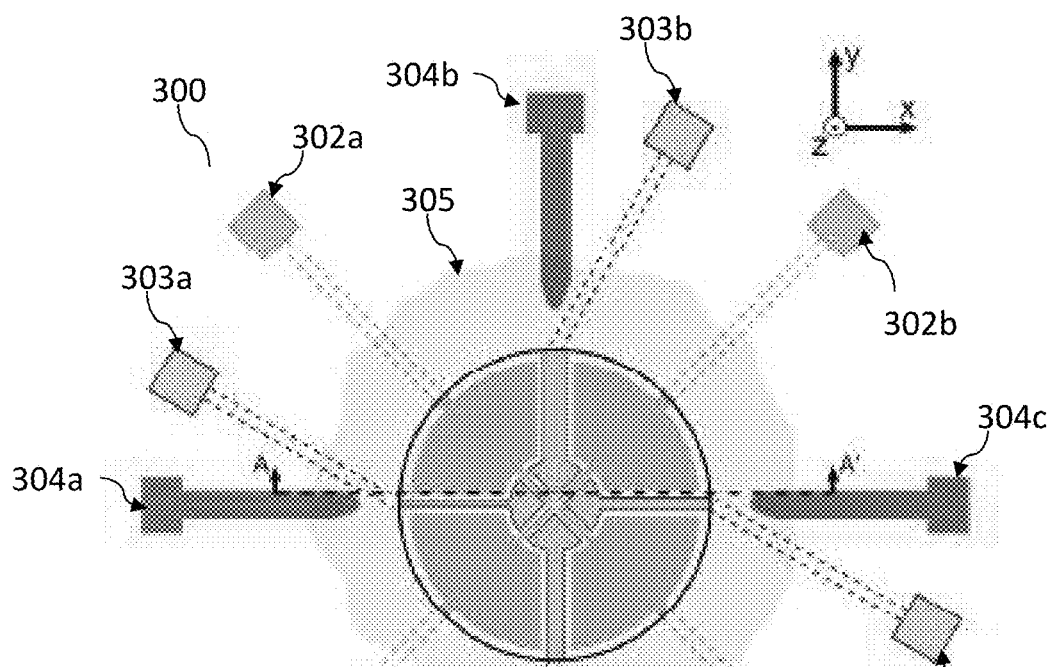
FIG. 3A depicts an overhead view of another membrane-based NEMS device that is an embodiment of the present invention.
Figure 3B:
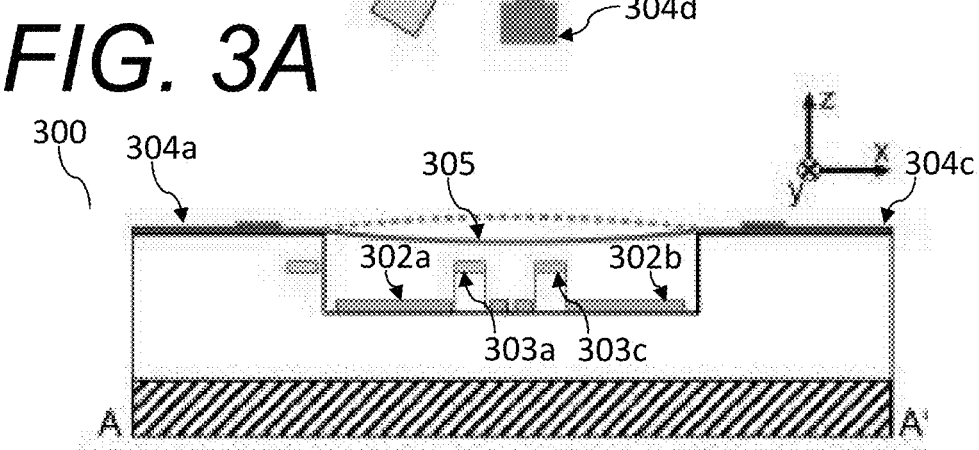
FIG. 3B depicts a cross-sectional side view (A-A') of the membrane-based NEMS device shown in FIG. 3A.

The 4-spoke membrane-based NEMS device 300 (as shown in FIGS. 3A-3B) is inherently symmetrical, as compared to the 3-spoke membrane-based NEMS device 100 (as show in FIG. 1) and 3-spoke membrane-based NEMS device 200 (as shown in FIGS. 2A-2C). Accordingly, 4-spoke membrane-based NEMS devices (such as 4-spoke membrane-based NEMS device 300) and its cross-section will be utilized for descriptive purposes.

FIG. 3A depicts an overhead view of a 4-spoke membrane-based NEMS device 300. Lower traces 302a, 302b, 302c, and 302d can be used as gates/drivers, middle traces 303a, 303b, 303c, and 303d can be used as drains/sensors, and upper traces 304a, 304b, 304c, and 304d can be used as sources. The membrane-based NEMS device 300 also includes an electrically conductive membrane 305 (graphene). The membrane-based NEMS device 300 can have drain/sensor trace widths (such as the widths of middle traces 303a and 303c) that are each unique so that tilting motion of a cylinder (such as a metal cylinder) (not shown in FIG. 3) can be differentiated from planer motion in the x-y plane.

Cross-section A-A', as given in FIG. 3A, is shown by the side view depicted in FIG. 3B. FIG. 3B shows how the electrically conductive membrane 305 (graphene) can be deflected (shown by solid and dashed lines) with the lower traces (302a and 302b). Maintaining the smallest possible gap between the electrically conductive membrane 305 (graphene) and lower traces (traces 303a and 303c as shown in FIG. 3B) dramatically increases the sensitivity of the membrane-based NEMS device 300 because capacitance is inversely proportional to this gap.

Figure 4:
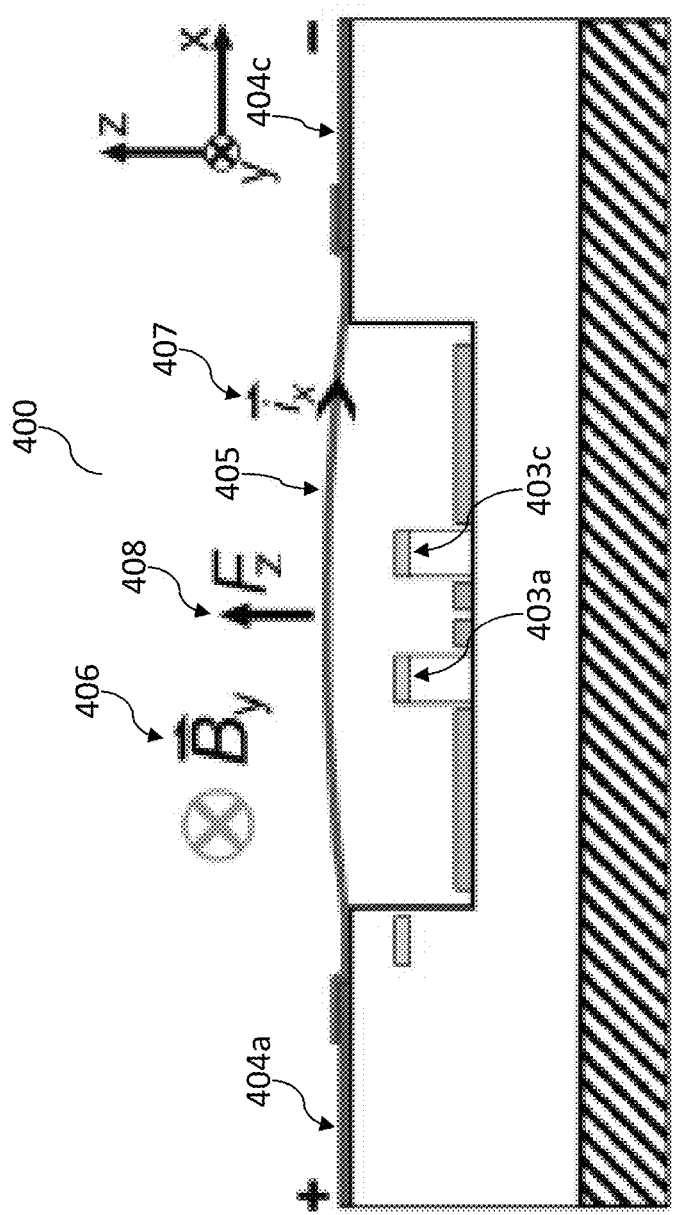
FIG. 4 depicts the same cross-sectional side view of the membrane-based NEMS device as shown in FIG. 3B showing the membrane-based NEMS device sensing an external magnetic field along one axis.

FIG. 4 depicts a membrane-based NEMS device 400 from the same cross-sectional side view as shown for membrane-based NEMS device 300 in FIG. 3B. In FIG. 4, the membrane-based NEMS device 400 is a membrane-based NEMS sensor that is sensing an external magnetic field B 406 along the y-axis. Current (i 407) from upper trace 404a, through the electrically conductive membrane 405 (graphene) and to upper trace 404c interacts with magnetic field B 406 to create a force F 408 along the z-axis. This force F 408 deflects the electrically conductive membrane 405 (e.g., graphene) in the direction of the z-axis (upward as illustrated in FIG. 4), increasing the gap between the electrically conductive membrane 405 and middle traces (such as middle traces 403a and 403c), which in turn lowers the capacitance between the upper traces (such as upper traces 404a and 404c) and the middle traces (such as middle traces 403a and 403c). This reduction in capacitance is related to the strength and direction of the external magnetic field B 406; therefore, the membrane-based NEMS device 400 is a magnetic field sensor (a membrane-based NEMS magnetic field sensor).

To increase the sensitivity of such a membrane-based NEMS magnetic field sensor 400, current (i 407) can be pulsed through the electrically conductive membrane 405 (graphene) at an electrical frequency equal to the mechanical resonant frequency of the electrically conductive membrane 405 (e.g., graphene), thus increasing the deflection of the electrically conductive membrane 405 (e.g., graphene) and related capacitance change.

The membrane-based NEMS device 400 can operate in air or vacuum, but will be more sensitive in vacuum because the current and the quality factor of the electrically conductive membrane 405 (e.g., graphene) resonance can be higher.

Figure 5:
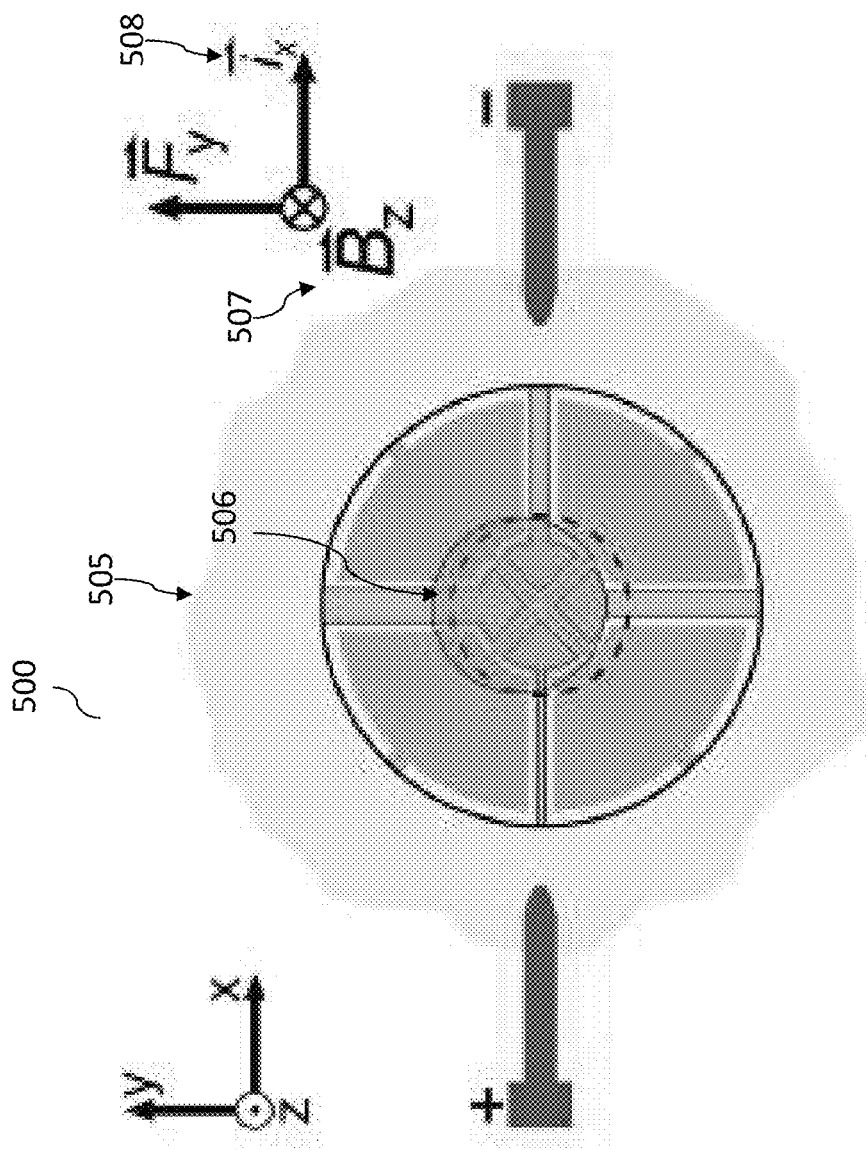
FIG. 5 depicts an overhead view of a membrane-based NEMS device having a metal cylinder on top of the electrically conductive membrane that can be used to measure an external magnetic field along three axes.

FIG. 5 shows how magnetic field B 507 can be measured along the z-axis (perpendicular to the plane of the electrically conductive membrane 505) with a metal cylinder 506 (or other material) mounted to the electrically conductive membrane 505. Similar to as shown in FIG. 4, the force from the AC current (i 508) is along the y-axis. Again, the electrical frequency can be optimally set to the mechanical frequency of the electrically conductive membrane 505 and the metal cylinder 506. The CM of metal cylinder 506 will oscillate through the y-z plane, and this oscillation will cause corresponding changes in capacitance between middle trances and the upper traces (which are related to the strength of the magnetic field B 507).

FIG. 6 shows how the membrane-based NEMS device of the present invention can be an accelerometer (a "membrane-based NEMS accelerometer"). If the membrane-based NEMS device 600 is accelerated along the x-axis in FIG. 6, this will create a force F 607 primarily along the x-axis that acts on the CM of the metal cylinder 606. Because the CM of the cylinder 606 is above the plane of the electrically conductive membrane 605 (e.g., graphene), a torque is created that pushes one side of the cylinder 606 in the negative z-direction and the other side in the positive z-direction. This movement of the CM creates a change in capacitance between middle traces (603a and 603c) and upper traces (604a and 604c) that can be converted into an acceleration value by an electronic circuit (not shown) electrically connected to the membrane-based NEMS device 600. For instance, a change in both absolute and relative capacitance would cause a voltage and/or current change in an analog sensing circuit operatively connected. This analog signal can be appropriately scaled via amplification with the output being either an analog or digital signal.

Accelerating the membrane-based NEMS device 600 along the z-axis will result in a reduction in the size of the gap between the electrically conductive membrane 605 (e.g., graphene) and both middle traces 603a and 603c shown in FIG. 6, which can be converted to an acceleration value.

Accelerating the membrane-based NEMS device 600 at some intermediate position between the z-axis and x-axis can create a capacitance change that can be interpreted as acceleration along that particular angle.

Figure 7:
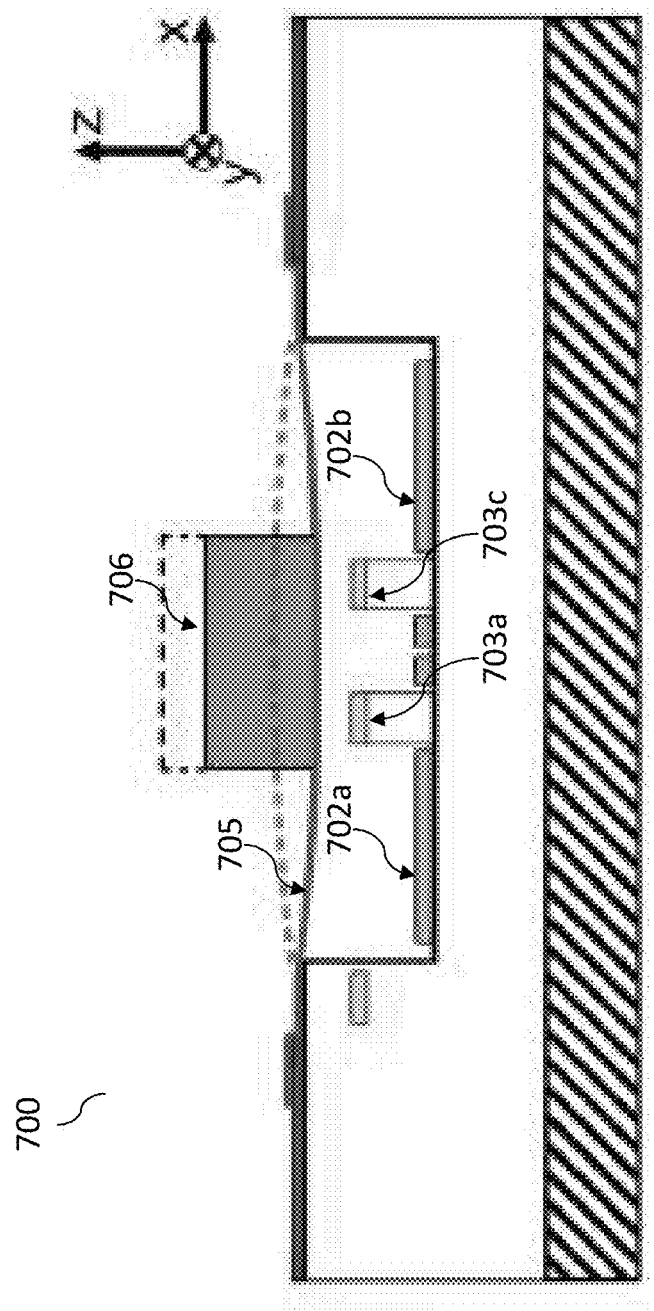
FIG. 7 depicts a side view of another membrane-based NEMS device that is an embodiment of the present invention that can be used as an oscillator/clock.

FIG. 7 shows a membrane-based NEMS device 700 being used as an oscillator/clock (similar to how a quartz crystal can be used to keep time). The lower traces (such as lower traces 702a and 702b) make the electrically conductive membrane 705 (and thus the affixed mass 706 on the electrically conductive membrane 705) oscillate along the z-axis. This oscillation is illustrated in FIG. 7 by the solid and dashed lines. The middle traces (such as 703a and 703c) of membrane-based NEMS device 700 sense this oscillation movement.

Furthermore, this functionality can be combined with other functionalities (such as the accelerometer function discussed above with respect to FIG. 6).

It is also possible to gyrate the CM of the metal mass 706 (i.e., metal cylinder) mounted on the electrically conductive membrane 705 and use it as a resonator/clock.

Figure 8:
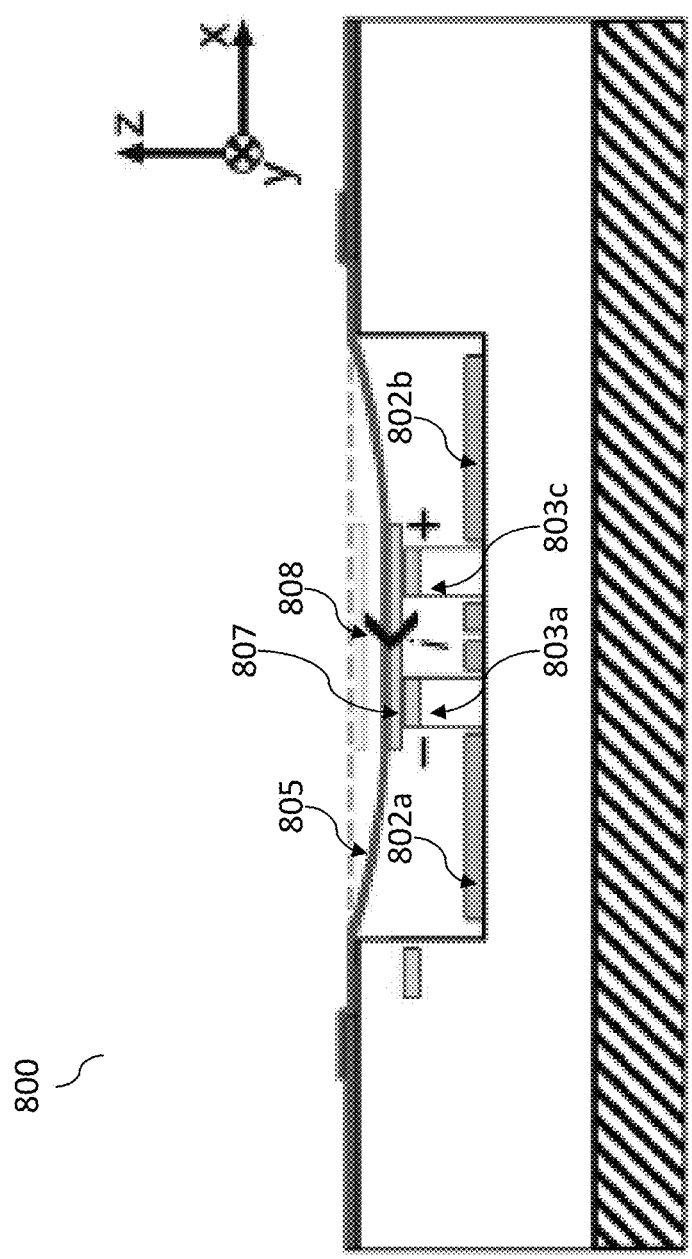
FIG. 8 depicts a side view of another membrane-based NEMS device that is an embodiment of the present invention that can be used as an electrical relay, variable capacitor, humidity sensor, or a barometer.

FIG. 8 shows a membrane-based NEMS device 800 being used as an electrical relay. A metal disc 807, such as a gold or platinum metal disc (or a disc of another metal or metals that do not readily oxidize in ambient air), is positioned on the side of the electrically conductive membrane 805 that is facing the middle traces (including middle traces 803a and 803c). A process for doing so during the graphene-copper etching process as described in PCT Patent Appl. No. PCT/US2011/066,497 (Everett, et al.). In such a process, the gold, platinum, or other metal disc is vapor deposited onto the electrically conductive membrane 805 before back etching the growth substrate.

One of the middle traces (such as middle trace 803a) is connected through an electrical load to ground and another one of the middle traces (such as middle trace 803c) is connected to a voltage (such as the positive terminal of a battery) (not shown). The lower traces (such as lower traces 802a and 802b) then pull down (a negative z-direction, as shown in FIG. 8) the metal disc 807 and electrically connect the two middle traces 803a and 803c. Very little of the current passes through the electrically conductive membrane 805 (e.g., graphene). Almost all of the current i (808) flows from one middle trace (middle trace 803c), through the metal disc 807, and to the other middle trace (middle trace 803a).

The "ON" resistance of this relay can be very low (under 1 ohm) due to the achieved metal-to-metal contact. Also, the combined mass of the moveable metal disc 807 and the electrically conductive membrane 805 is much lower than a MEMS relay (on the order of one million times lower) so the wear per cycle is significantly lower. In addition, the multiple lower traces (such as lower traces 802a and 802b) can be used to pull the metal disc 807 down in many different ways to further reduce wear. For example, one edge of the metal disc 807 can "land" on the grounded middle trace (middle trace 803a) first and then be angled down toward the "hot" middle trace (middle trace 803c) to lower wear and, thus, increase cycle life. Also, the angle of the metal disc 807 in the y-z plane can be changed over time to further reduce wear by creating various contact points throughout the lifetime of the device.

The membrane-based NEMS device 800 of FIG. 8 can also be used as a humidity sensor. The lower traces (such as lower traces 802a and 802b) can make the electrically conductive membrane 805 and disc 807 oscillate at its combined mechanical resonant frequency. Current (not marked in FIG. 8) can be passed between the two upper traces 804a and 804c (and through the electrically conductive membrane 805 between upper traces 804a and 804c) to boil off any water film on the electrically conductive membrane 805. (This is not the same current (i 808) shown in FIG. 8, which is passed between one middle trace (middle trace 803c), through the metal disc 807, and to the other middle trace (middle trace 803a). The current passing between the upper traces 804a and 804c will cause the electrically conductive membrane 805 to heat up substantially (thereby causing the removal of the water film from the electrically conductive membrane 805). Current (i 808) (which passes primarily through the disc 807) will also cause some joule heating of the metal disc 807, which in turn will radiate to the electrically conductive membrane 805. However, this is a much less efficient process to quickly heat the entire electrically conductive membrane 805.

After the water film of the electrically conductive membrane 805 is removed, the mechanical resonant frequency can then be measured again and will be measurably increased because the mass of the moveable metal disc 807 and the electrically conductive membrane 805 without the water film is lower than the mass of the moveable metal disc 807 and the electrically conductive membrane 805 with the water film. An appropriate electrical circuit (not shown) can repeat this process to determine how fast water droplets bind to the electrically conductive membrane 805 and thus find the humidity of the air.

The basic process of boiling off water vapor from the membrane-based NEMS device 800 using current between two or more upper traces 804a and 804c can enhance the functionality of many of the NEMS applications if the membrane-based NEMS device 800 is operated in an ambient environment. For example, the lack of a water film on the electrically conductive membrane 805 (graphene) and metal disc 807 can reduce the probability of transient or permanent bonding of the moveable and stationary elements of the membrane-based NEMS device of the present invention.

The membrane-based NEMS device 800 of FIG. 8 can also be used as a barometer if operated in air. The lower traces (such as lower traces 802a and 802b) can make the electrically conductive membrane 805 oscillate at its mechanical resonant frequency, stop (though still maintain a small gap between the electrically conductive membrane 805 and the trace with a DC voltage) and the drain/sensor finger traces (along with an electronic circuit not shown) can sense the decay of this oscillation (which is related to the density of the air).

In some embodiments of the present invention, membrane-based NEMS device 800 can have a disc made of non-metal. For instance, it can be made of a non-conductive material that will insure that there is no electrically connection from middle traces 803a and 803c in the event the electrically conductive membrane 805 moved to a position such that it was in contact with middle traces 803a and 803c.

Figure 9:
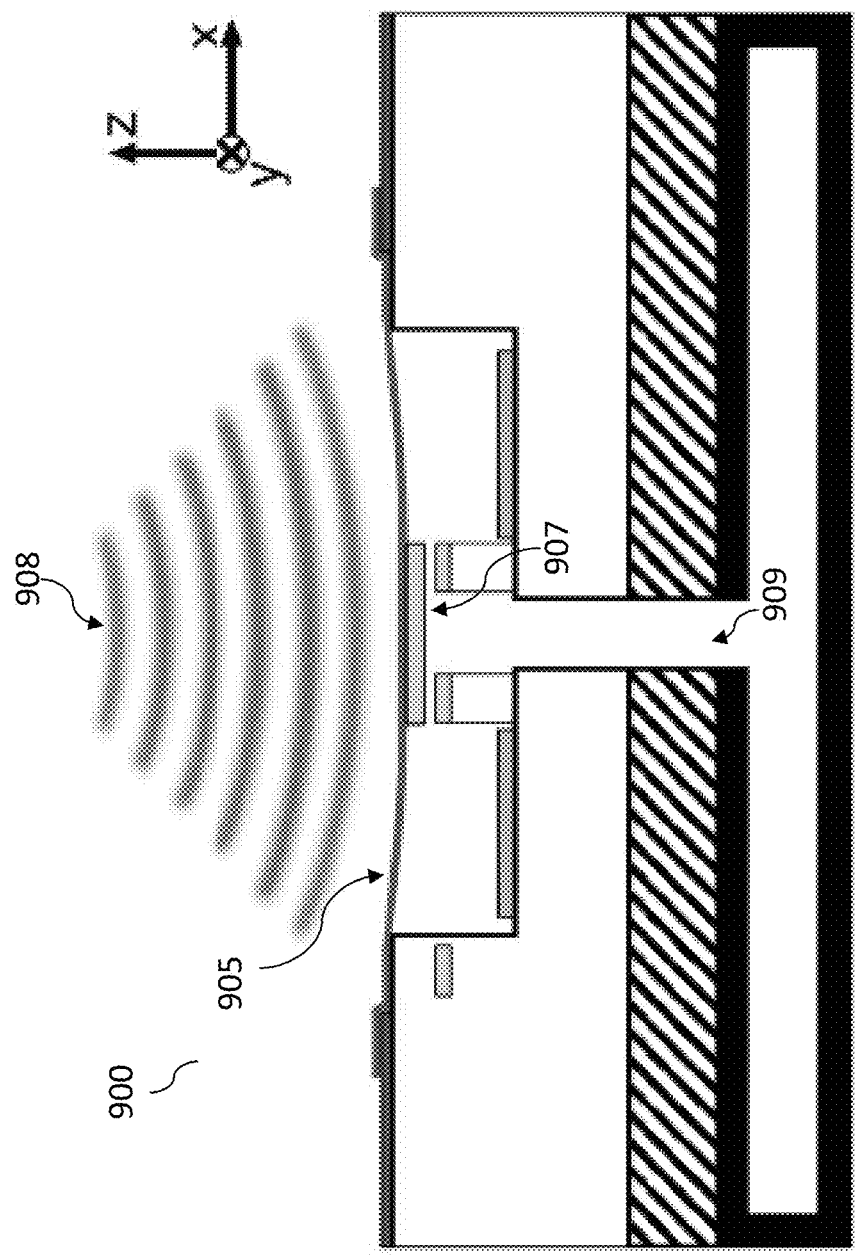
FIG. 9 depicts a side view of another membrane-based NEMS device that is an embodiment of the present invention that can be used as a microphone, gas pressure sensor, or a variable capacitor.

FIG. 9 shows a membrane-based NEMS device 900 being used as a microphone. Sound waves 908 make the electrically conductive membrane 905 move back in forth in a direction of the z-axis, which changes the capacitance between the source and drain/sensor leads. Electronics known in the art (not shown) can convert these capacitance changes into a signal representing the incoming sound. The sensitivity of the microphone can be enhanced significantly by using the gate/driver to maintain a small gap between the electrically conductive membrane 905 (and/or the attached metal disc 907) and the middle traces. If there is a very loud sound (such as a gunshot) the electrically conductive membrane 905 (and an optionally added metal disc 907, as shown) will make contact over a vent hole 909 and seal off the cavity, which will in turn create an internal air pressure that will counteract the external air pressure and prevent the membrane-based NEMS device 900 from damage.

The membrane-based NEMS device 900 of FIG. 9 can also be used as a gas pressure sensor.

The membrane-based NEMS device 900 of FIG. 9 can also be used as a variable capacitor. The lower traces can vary the gap between the electrically conductive membrane 905 and the middle traces and, thus, vary the capacitance between the upper traces and the middle traces.

Optionally, a membrane-based NEMS device 900 can have more than one channel so that multiple lower trances can simultaneously change multiple upper trance/middle trace gaps.

The capacitance of the membrane-based NEMS device 900 can also be changed between two middle trace leads that are capacitively-coupled through the electrically conductive membrane 905 and/or the metal disc 907 affixed to the electrically conductive membrane 905. Because the mass of the electrically conductive membrane 905/metal disc 907 is so much smaller than the moving element of a conventional variable capacitor, membrane-based NEMS device 900 can operate at much higher frequencies.

Figure 10:
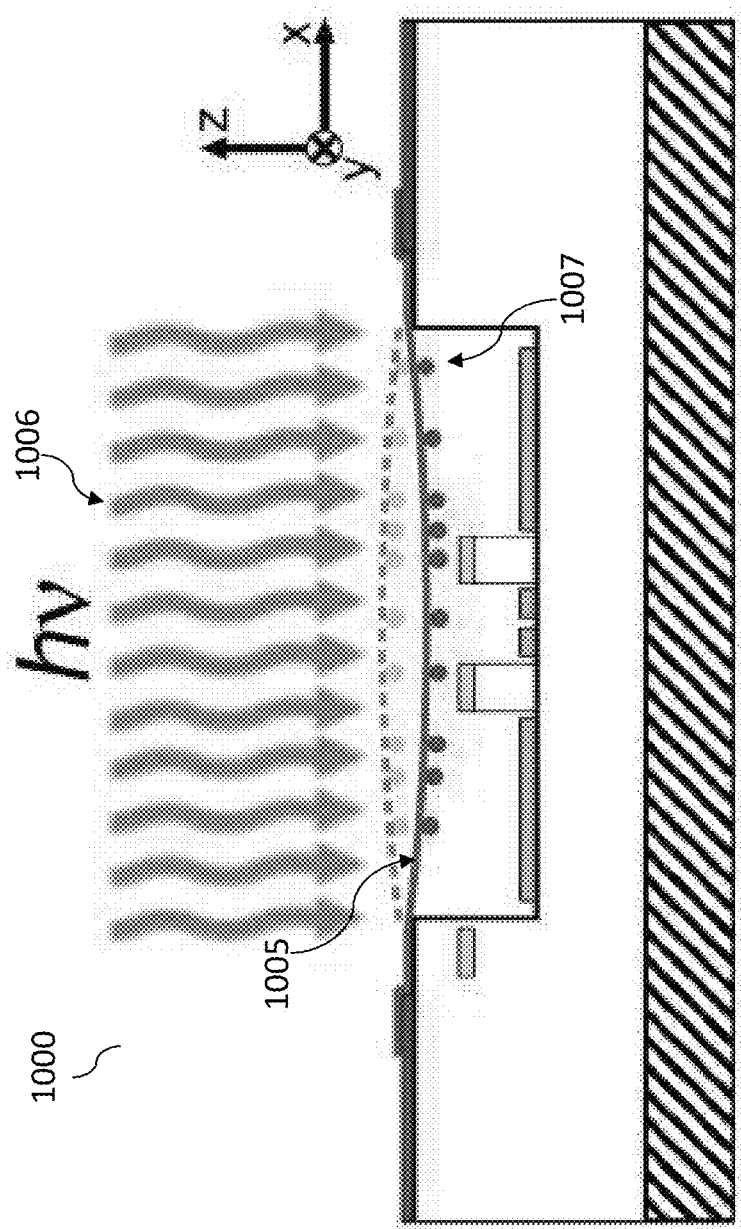
FIG. 10 depicts a side view of another membrane-based NEMS device that is an embodiment of the present invention that can be used to measure temperature or specific frequencies of radiation, as an electronic camera and/or a thermal imager.

FIG. 10 shows a membrane-based NEMS device 1000 capable of measuring temperature, in general, and, alternatively, capable of sensitively detecting specific frequencies of electromagnetic radiation 1006. When a graphene membrane 1005 is heated, it will contract (unlike most materials that expand with increasing temperature). This will make the graphene membrane 1005 more taught, thus increasing its mechanical resonant frequency. The gate/driver can drive the graphene membrane 1005 at its mechanical resonant frequency and the drain/sensor leads (along with an electrical circuit not shown) can measure how this frequency changes over time (thus how the temperature changes over time).

In some embodiments, nanoparticles 1007 can be deposited onto the suspended graphene membrane 1005 and be sized to preferentially absorb light energy at certain frequencies/colors bands. If a target light frequency interacts with the graphene membrane 1005 (or other electrically conductive membranes) modified with absorbing nanoparticles 1007 (e.g., quantum dots, metallic nanorods, and/or spheres, etc.), these absorbing nanoparticles 1007 will absorb this radiation and thus heat up the graphene membrane 1005 (more so than graphene membranes decorated with different size and/or shape nanoparticles 1007). An array of these membrane-based NEMS devices 1000 can be used as an electronic camera and/or a thermal imager.

Figure 11A:
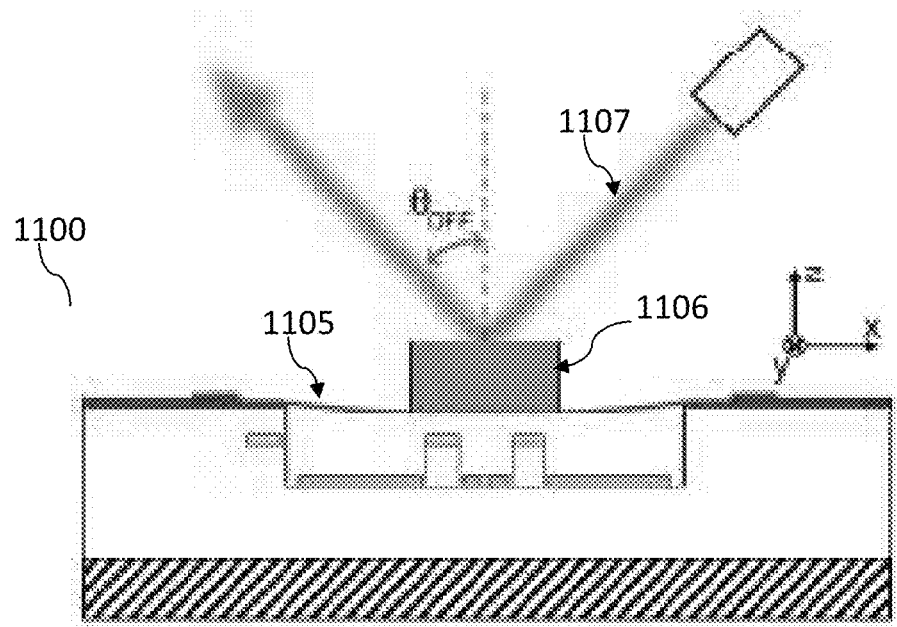
FIGS. 11A-11B depict a side view of another membrane-based NEMS device that is an embodiment of the present invention that can be used to direct a light signal (or, alternatively, a laser position measurement system, or to route light signals to/from a fiber optic cable).
Figure 11B:
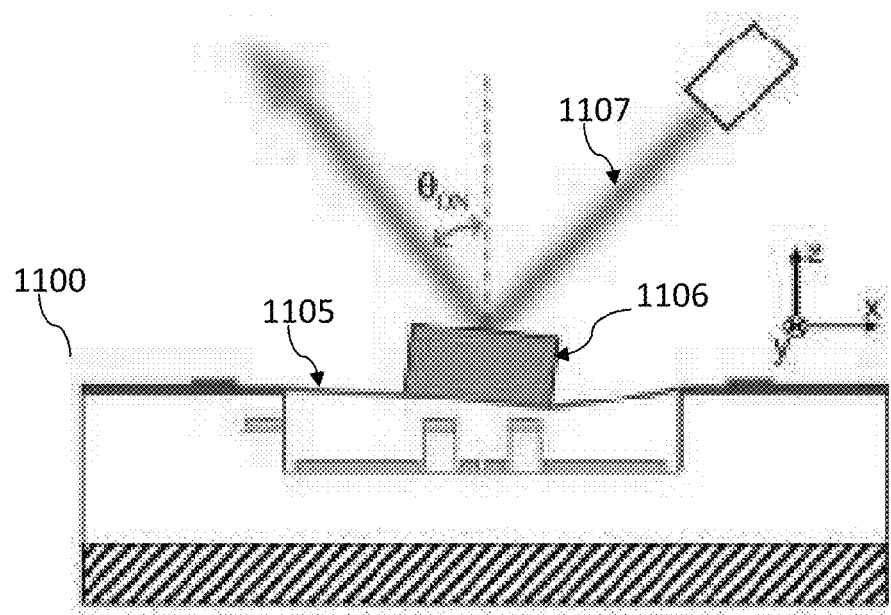

FIGS. 11A-11B show a membrane-based NEMS device 1100 being used to direct a light signal 1107. FIGS. 11A-11B also show an alternate way to track the motion of the reflective cylinder/disc 1106 mounted on the electrically conductive membrane 1105 (a laser position measurement system, as is known in the art).

Like a MEMS micro-mirror array used to direct light in digital light projectors, the membrane-based NEMS device 1100 can rapidly move a reflective surface (such shown by the change of orientation of reflective disk 1106 in FIG. 11A and FIG. 11B) and the incident light 1107 will be directed towards a target. Unlike a MEMS micro-mirror array, which is limited to movement in the kHz range, the membrane-based NEMS device 1100 can switch light in the MHz range.

The membrane-based NEMS device 1100 can also be used to route light signals to/from a fiber optic cable. Although one NEMS mirror device 1100 is shown in FIG. 11, a typical system would employ an array of thousands (or more) of individually addressable membrane-based NEMS devices.

Figure 12A:
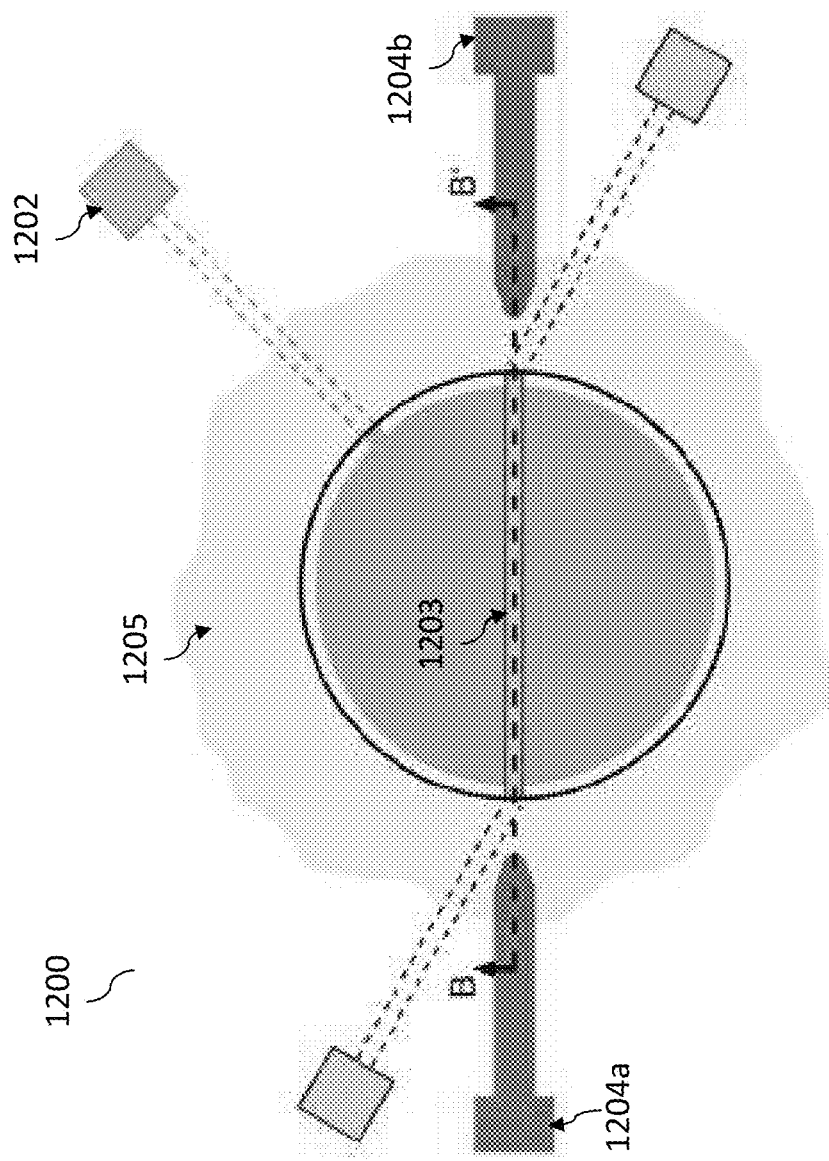
FIG. 12A depicts an overhead view of another membrane-based NEMS device that is an embodiment of the present invention that can be used as a variable inductor.
Figure 12B:
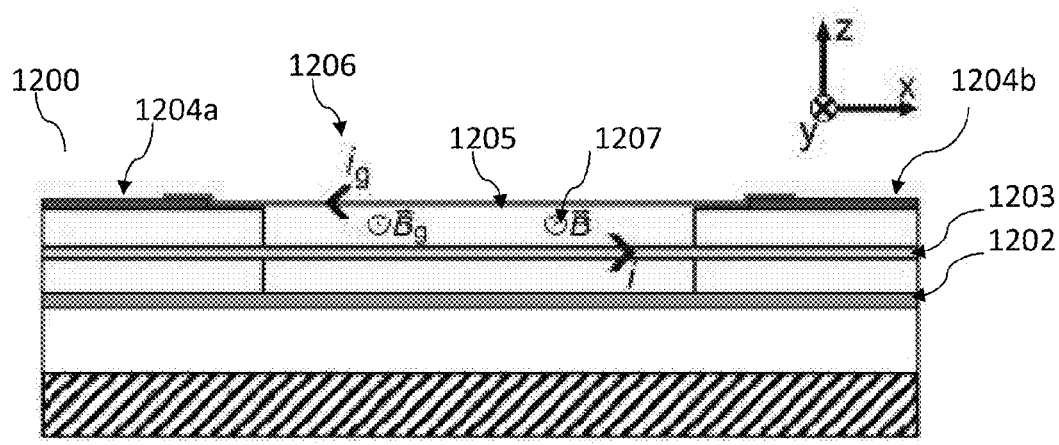
FIGS. 12B-12C depict side views of the NEMS device of FIG. 12A.
Figure 12C:
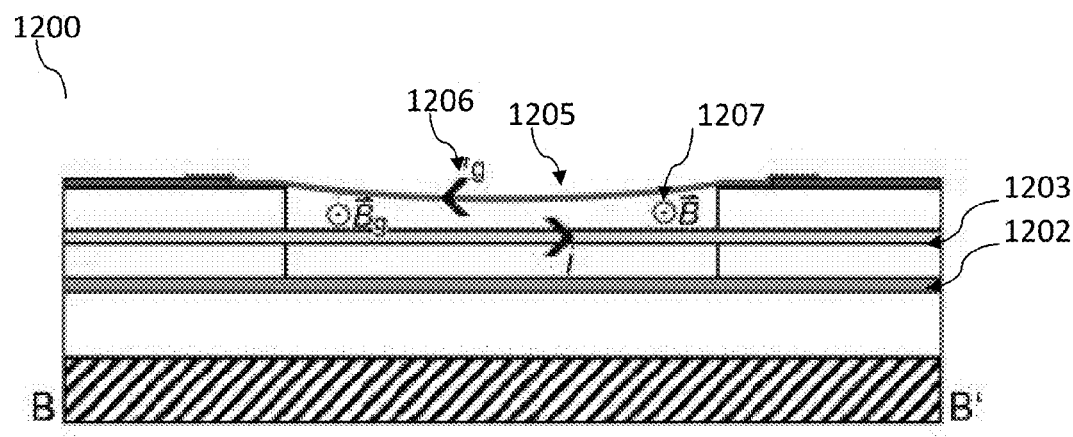

The membrane-based NEMS device 1200 of FIGS. 12A-12C can be used as a variable inductor. Current i (1206) passes through the electrically conductive membrane 1205 in one direction (shown in a negative x-axis direction going from upper trace 1204b, through electrically conductive membrane 1205, and to upper trace 1204a) and through a continuous middle trace 1203 in the opposite direction (shown in a positive x-axis direction). When the lower trace 1202 varies the distance between these two conductive "wires" (as shown between FIGS. 12B and 12C), the electrical inductance of the circuit is changed. Because the electrically conductive membrane 1205 is nearly mass-less, it can operate in the GHz range (compared to MEMS variable inductors that are operated below 1 MHz).

Figure 13:
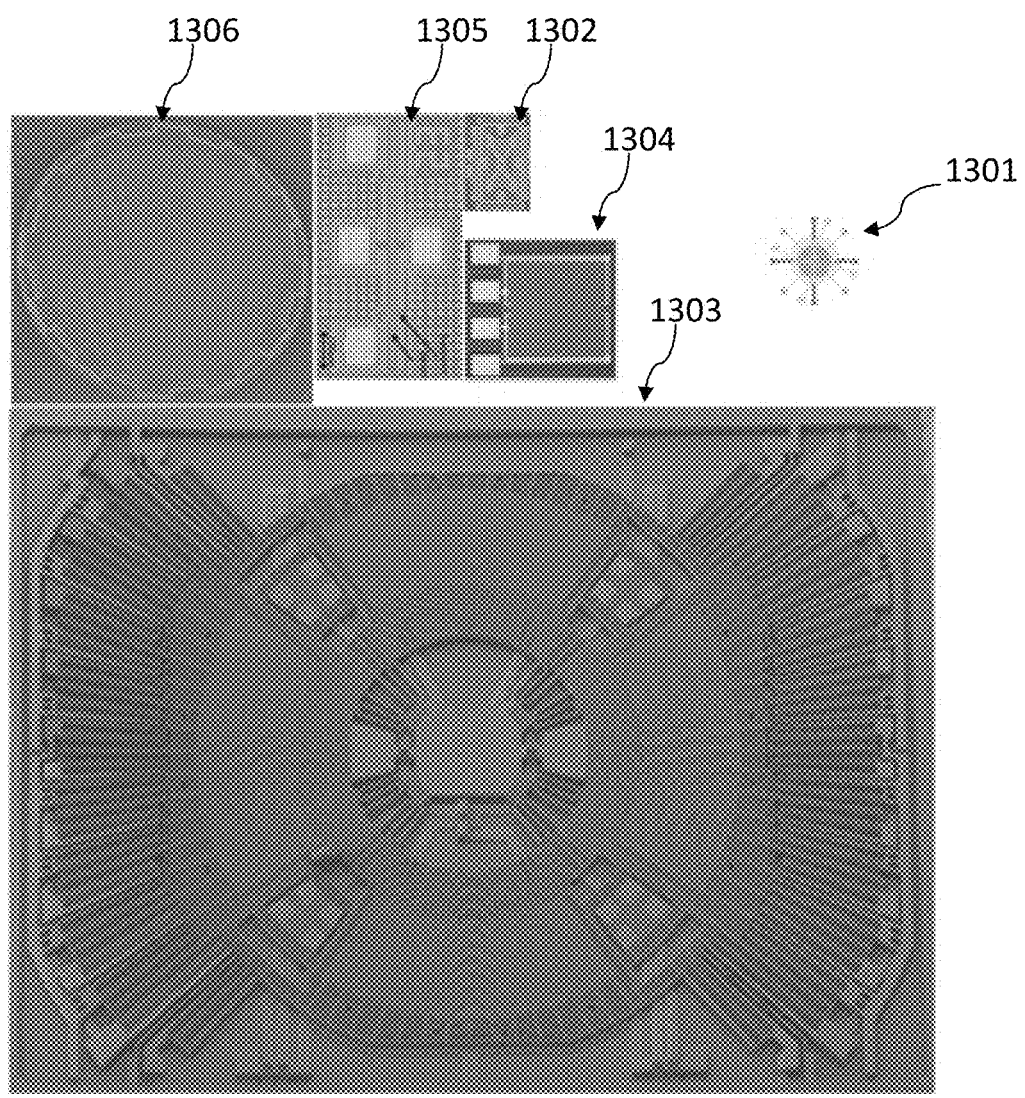
FIG. 13 shows the size and design differential between one membrane-based NEMS device that is an embodiment of the present invention and four different MEMS devices that collectively perform the same functions as the one NEMS device.

Multiple functions can be performed with one electrically conductive membrane in the membrane-based NEMS device of the present invention, saving both space and cost. For example, it is possible to have one membrane-based NEMS device of the present invention function as an accelerometer, gyroscope, magnetometer and microphone (all functions required in smart phones). FIG. 13 shows the size/simplicity of one membrane-based NEMS device 1301 relative to state of the art MEMS devices 1302, 1303, 1304, 1305 and 1306) that must perform the same set of functions (accelerometer, gyroscope, pressure sensor, magnetometer and microphone, respectively).

Simultaneous operation of multiple functions is possible with one electrically conductive membrane, (which may also include an attached metal cylinder or disc), along with sequential scrolling through functions with one electrically conductive membrane for redundancy. For instance, a membrane-based NEMS device in accordance with the present invention can have four electrically conductive membrane drums capable of several functions. If one electrically conductive membrane becomes inoperable, another can pick up its function based on a list of priorities. Furthermore, the electrically conductive membrane of the membrane-based NEMS device of the present invention can be housed in air or vacuum packages depending on use. Also, this design can be used such that there are one or more functions per electrically conductive membrane (and different levels of sensitivity for certain functions) that can be changed with software/firmware settings in electrical circuits (not shown).

The ability of the membrane-based NEMS device to perform multiple functions is one reason that this device is smaller (and saves costs) but this is not the only reason. Indeed, generally other reasons have even more affect on the size and cost advantages related to these devices. As can be seen from FIG. 13, the membrane-based NEMS device of the present invention is less than 1% the size of just the MEMS gyroscope device (which has nothing to do with the size savings due to multifunction features).

Other factors that provide size saving advantages by the membrane-based NEMS device include:

The membrane-based NEMS devices can use a third terminal to actively minimize the length of the sensing gap. I.e., in the present invention, the sensing gap can be on the order of nanometers instead of the micrometers of MEMS devices. Measurement sensitivity is inversely proportional to this gap.

The supporting membrane of the membrane-based NEMS device of the present invention is on the order of 1000 times thinner than a MEMS device. Accordingly, a given force will generally produce a greater deflection of the sensing structure in the membrane-based NEMs device (as compared with a MEMS device).

The sensing area of the membrane-based NEMS device of the present invention is not linked with its support structure thickness, which enables the membrane-based NEMS device to minimize support stiffness without compromising capacitive sensing area.

The membrane-based NEMS device of the present invention can use the entire area of its proof mass as active sensing area whereas the majority of the proof mass of MEMS gyroscope/accelerometer devices are "dead weight."

The membrane-based NEMS device of the present invention is able to use dense metals (like Cu or Au) as its proof mass instead of much less dense $Si/SiO_2$ of MEMS gyro/accelerometer devices. (It depends on the circumstances as to what size and density are used in the membrane-based NEMS device. As noted above, there may be other embodiments of the present invention where a lighter weight cylinder is more applicable so that a smaller response is received from the less massive cylinder. In such instance, a less-dense, non-metallic material may be preferable).

The center of mass of the proof mass of the membrane-based NEMS device of the present invention can be used to create a torque (because it is out of plane with its support structure) that can create large changes in sensing capacitance in response to small forces.

Deflections in one axis of the membrane-based NEMS device of the present invention do not compromise measurement sensitivity in either of the other two axis. In MEMS devices, generally there is a small sensing gap for x deflections that will severely limit travel for y deflections.

For membrane-based NEMS magnetometer devices of the present invention, the entire length and area of the membrane support structure can be used to create Lorentz forces. The membrane-based NEMS device of the present invention can also use the extremely high current density of graphene to further increase these forces.

A number of embodiments of the invention have been described. Nevertheless, it will be understood that various modifications may be made without departing from the spirit and scope of the invention. Accordingly, other embodiments are within the scope of the following claims.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. For example, electrically conductive membranes can be layered or stacked (for instance, vertically) in the membrane-based NEMS devices to increase output. Also, the electrically conductive membranes can be shapes other than circles such as squares or rectangles (i.e., the use of the terms "membranes" and "drums" does not limit the shape). In addition, one or more electrically conductive membranes in a system may be placed in a vertical plane while another electrically conductive membrane in the same system is placed in a horizontal plane. Accordingly, other embodiments are within the scope of the following claims. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

What is claimed is:

1. A sensor comprising:
   (a) a substrate having a cavity;
   (b) a thin electrically conductive membrane bounding at least part of the cavity;
   (c) a first source trace electrically connected to the thin electrically conductive membrane;
   (d) a first sensor trace operatively connected to the substrate;
   (e) a first gate trace operatively connected to the substrate; and
   (f) a second sensor trace located within the cavity.

2. The sensor of claim 1, wherein the thin electrically conductive membrane covers the cavity.

3. The sensor of claim 1, wherein the thin electrically conductive membrane comprises one layer of graphene.

4. The sensor of claim 1, wherein the thin electrically conductive membrane comprises multiple layers of graphene.

5. The sensor of claim 1, wherein the first gate trace is located within the cavity.

6. The sensor of claim 1, wherein the first sensor trace is located between the first gate trace and the thin electrically conductive membrane.

7. The sensor of claim 1 further comprising a second source trace electrically connected to the thin electrically conductive membrane.

8. The sensor of claim 1 further comprising an array of particles mechanically connected to the thin electrically conductive membrane.

9. The sensor of claim 8, wherein the particles comprise quantum dots.

10. A sensor comprising:
    (a) a substrate having a cavity;
    (b) a thin electrically conductive membrane bounding at least part of the cavity;
    (c) a first source trace electrically connected to the thin electrically conductive membrane;
    (d) a first sensor trace operatively connected to the substrate;
    (e) a first gate trace operatively connected to the substrate;
    (f) a proof mass mechanically connected to the thin electrically conductive membrane, wherein the proof mass was a mass made by the process wherein the proof mass was chemically etched from the same metallic foil used to grow the thin electrically conductive membrane.

11. The sensor of claim 10, wherein the proof mass comprises metal.

12. The sensor of claim 10, wherein the proof mass comprises copper.

13. A sensor comprising:
(a) a substrate having a cavity;
(b) a thin electrically conductive membrane bounding at least part of the cavity;
(c) a first source trace electrically connected to the thin electrically conductive membrane;
(d) a first sensor trace operatively connected to the substrate;
(e) a first gate trace operatively connected to the substrate; and
(f) a second gate trace located within the cavity.

14. A sensor comprising:
(a) a substrate having a cavity;
(b) a thin electrically conductive membrane bounding at least part of the cavity;
(c) a first source trace electrically connected to the thin electrically conductive membrane;
(d) a second source trace electrically connected to the thin electrically conductive membrane;
(e) a first sensor trace located within the cavity; and
(f) a third source trace electrically connected to the thin electrically conductive membrane.

15. The sensor of claim 14 further comprising a first gate trace located within the cavity.

16. The sensor of claim 14, wherein the thin electrically conductive membrane comprises one layer of graphene.

17. The sensor of claim 14, wherein the thin electrically conductive membrane comprises multiple layers of graphene.

18. The sensor of claim 14, wherein the thin electrically conductive membrane covers the cavity.

19. A sensor comprising:
(a) a substrate having a cavity;
(b) a thin electrically conductive membrane bounding at least part of the cavity;
(c) a first source trace electrically connected to the thin electrically conductive membrane;
(d) a second source trace electrically connected to the thin electrically conductive membrane;
(e) a first sensor trace located within the cavity; and
(f) a second sensor trace located within the cavity.

* * * * *